United States Patent [19]

Molnar

[11] Patent Number: 5,410,310
[45] Date of Patent: Apr. 25, 1995

[54] METHOD AND APPARATUS FOR EXTENDING THE RESOLUTION OF A SIGMA-DELTA TYPE ANALOG TO DIGITAL CONVERTER

[75] Inventor: Richard J. Molnar, Willoughby, Ohio

[73] Assignee: Elsag International N.V., Amsterdam, Netherlands

[21] Appl. No.: 222,426

[22] Filed: Apr. 4, 1994

[51] Int. Cl.⁶ .................... H03M 3/02; H03M 1/20; H03M 1/50
[52] U.S. Cl. .................... 341/143; 341/131; 341/164
[58] Field of Search ......... 341/143, 131, 155, 164–170

[56] References Cited

U.S. PATENT DOCUMENTS

| | | | |
|---|---|---|---|
| 3,701,142 | 10/1972 | Cannara | 341/167 |
| 3,703,001 | 11/1972 | Hibbs, Jr. | |
| 3,737,893 | 6/1973 | Belet et al. | 341/118 |
| 3,878,465 | 4/1975 | Stephenne et al. | |
| 3,990,073 | 11/1976 | Duttweiler | |
| 4,070,707 | 1/1978 | Barber | 341/120 X |
| 4,243,974 | 1/1981 | Mack | 341/164 X |
| 4,268,820 | 5/1981 | Hareyama | 341/168 |
| 5,097,264 | 3/1992 | Brenner et al. | 341/167 |
| 5,134,401 | 7/1992 | McCartney et al. | 341/143 |
| 5,184,128 | 2/1993 | Snow | 341/167 X |
| 5,329,281 | 7/1994 | Baumgartner et al. | 341/139 |

OTHER PUBLICATIONS

Van De Plassche, Rudy J., "A Sigma-Delta Modulator as an A/D Converter." IEEE Transactions on Circuits and Systems, vol. Cas-25, No. 7, (Jul. 1978); pp. 510–514.

Cheung, Peter Y. K. and See, Eric S. K., "A Comparison of Decimation Filter Architectures for Sigma-Delta A/D Converters." 1991 IEEE International Symposium on Circuits and Systems, vol. 3 of 5, (Jun. 1991); pp. 1637–1640.

*Primary Examiner*—Sharon D. Logan
*Attorney, Agent, or Firm*—Michael M. Rickin; Paul R. Katterle

[57] ABSTRACT

A sigma-delta technique is used to generate a digital representation of the incoming analog signal amplitude. The integration stage of the converter holds an analog error term relative to the ratio of an incoming analog input signal to a reference voltage. The incoming analog signal is disconnected at the end of the conversion. The error term is monitored through a comparator as charge packets are applied to the input of the integration stage. The number of charge packets needed to have the error term cross zero provides information which can be used to extend the resolution of the analog to digital converter.

6 Claims, 2 Drawing Sheets

METHOD AND APPARATUS FOR EXTENDING THE RESOLUTION OF A SIGMA-DELTA TYPE ANALOG TO DIGITAL CONVERTER

BACKGROUND OF THE INVENTION

1. Field of the Invention

This invention relates to analog to digital conversion and more particularly to a method and apparatus for use with analog to digital converters of the sigma-delta type.

2. Description of the Prior Art

The sigma-delta modulator has been known since 1962. However, it was not until the recent advances in integrated circuit technology that related techniques became cost effective for use in high precision analog to digital converters of the sigma-delta type. The sigma-delta type converter typically consists of digital circuitry with a small amount of analog circuitry.

Existing techniques use the concepts of noise shaping, oversampling rate, and decimation to achieve the performance seen in the known sigma-delta type analog to digital converters. Some of these known converters are designed for use in the audio market which requires, for example, 16 bit resolution of a 20 KiloHertz signal. However, in industrial control applications the requirement can be to convert a DC signal to a few Hertz analog signal with greater than 16 bit resolution.

A good reference which describes the functionality of a sigma-delta modulator for use in analog to digital conversion is "A Sigma-Delta Modulator as an A/D Converter", by Rudy J. van de Plassche, IEEE Transactions on Circuits and Systems, Vol. CAS-25, No. 7, July 1978.

A sigma-delta converter quantizes an incoming analog signal with one (1) bit resolution using "oversampling", that is, an extremely high sampling rate relative to the highest frequency of interest of the incoming analog signal. The term "oversampling" refers to the relationship between the frequency or sampling rate at which the converter samples as compared to the well known Nyquist rate. The Nyquist rule states that the sampling rate must be at least twice the maximum frequency of the measured analog signal in order to prevent aliasing effects.

Existing methods often use decimation filter techniques in the digital filtering section of a sigma-delta analog to digital converter. Several decimation techniques are described in "A Comparison of Decimation Filter Architectures for Sigma-Delta A/D Converters", by Peter Y. K. Cheung, Eric S. K. See, 1991 IEEE International Symposium on Circuits and Systems, Vol. 3 of 5, Analog, Circuits and Neural Networks, Singapore, 11–14 Jun. 1991, pp. 1637–1640.

One such decimation technique is to use a comb filter. At first glance the use of a decimation comb filter appears to yield substantial benefits, because it is a technique which allows a one (1) bit stream at 640 KHz for example, to construct 12 bits at 40 KHz. This seems impressive considering that the resolution increases by a factor of 4096 while the frequency drops by a factor of only 16.

Allowing the comb filter to run continuously does provide improved performance because it acts as one huge moving average. However, there are problems associated with the use of a decimation comb filter. One such problem, as those skilled in the art will appreciate, is that a decimation comb filter usually requires additional digital filtering to compensate for out of band noise. Another such problem is associated with the mechanism used by the comb filter to accomplish the decimation filtering. This mechanism requires that either only one analog input channel is connected to a sigma-delta converter or, if the comb filter serves more than one channel, the necessity to store the data related to each channel in order to maintain continuous operation of the decimation comb technique as analog input channels are alternated. The amount of storage required will depend on the complexity of the comb filter and the number of channels served by the filter.

SUMMARY OF THE INVENTION

A method for use in a sigma-delta type analog to digital converter having an input and output to obtain an extended representation at said converter output of an analog signal amplitude present at said converter input, the method having the steps of:

i. generating internal to the converter at the end of a first predetermined interval of time an unextended digital representation of the analog signal amplitude present at the converter input;

ii. holding a charge representative of an error term in the unextended digital representation at the first predetermined interval of time end;

iii. disconnecting the analog signal from the input at the first predetermined interval of time end;

iv. determining from the error term representative charge one bit that represents the polarity of a charge to be repetitively applied to the error term representative charge to cause the error term representative charge to cross zero;

v. applying repetitively for a second predetermined interval of time the zero crossing charge with the determined polarity to the error term representative charge;

vi. counting with a predetermined number of counting bits each of the repetitive applications of the zero crossing charge with the determined polarity except for the first repetitive application, the counting ending when the error term representative charge crosses zero;

vii. appending when the counting ends the polarity and the repetitive applications count to the unextended digital representation; and viii. extending when the counting ends the unextended digital representation by:

a. virtually shifting in a predetermined direction said unextended representation by said predetermined number of counting bits and said one bit for said determined polarity;

b. adding said repetitive applications count when said counting ends to said unextended digital representation if said polarity is in one direction; or c. subtracting said repetitive applications count when said counting ends from said unextended digital representation if said polarity is in an opposite direction, to thereby obtain the extended digital representation at the converter output.

An apparatus for use in a sigma-delta type analog to digital converter having an input and output to obtain an extended representation at said converter output of an analog signal amplitude present at said converter input, said apparatus comprising:

i. means for generating internal to said converter at the end of a first predetermined interval of time an unextended digital representation of said analog signal amplitude present at said converter input;

ii. means for holding a charge representative of an error term in said unextended digital representation at said first predetermined interval of time end;

iii. means for disconnecting said analog signal from said input at said first predetermined interval of time end;

iv. means responsive to said error term representative charge for determining one bit that represents the polarity of a charge to be repetitively applied to said error term representative charge to cause said error term representative charge to cross zero;

v. means for applying repetitively for a second predetermined interval of time said zero crossing charge with said determined polarity to said error term representative charge;

vi. means for counting with a predetermined number of bits each of said repetitive applications of said zero crossing charge with said determined polarity except for said first repetitive application, said counting means ceasing counting when said error term representative charge crosses zero;

vii. means responsive to said counting means ceasing counting for appending said polarity and said repetitive applications count to said unextended digital representation; and viii. means responsive to said counting means ceasing counting for extending said unextended digital representation, said extending means:

a. first virtually shifting in a predetermined direction said unextended representation by said predetermined number of counting bits and said one bit for said determined polarity; and then either b. adding said repetitive applications count when said counting ends to said unextended digital representation if said polarity is in one direction; or c. subtracting said repetitive applications count when said counting ends from said unextended digital representation if said polarity is in an opposite direction, to thereby obtain said extended digital representation at said converter output.

DESCRIPTION OF THE PREFERRED EMBODIMENTS

Figure 1:
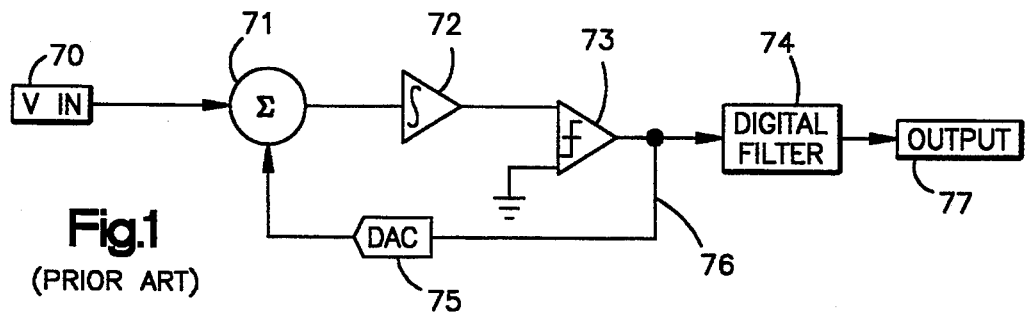
FIG. 1 is a block diagram of a prior art typical sigma-delta analog to digital converter.

Depicted in FIG. 1 is a block diagram of a typical prior art sigma-delta analog to digital converter circuit. The analog input 70 and DAC (digital to analog converter) 75, feed into a summer 71. The integrator 72 has its input connected to the output of the summer 71 and its output connected to one input of a comparator 73 which has its other input connected to ground. The one (1) bit digital output 76 of comparator 73 goes high or low based on the relationship of the integrator 72 output to ground. The input to DAC 75 is connected to the output 76 and decides whether to apply a positive or negative signal to the summer 71 based on output 76. The digital filter 74 takes in the one (1) bit output 76 and produces a multiple bit digital output 77 representative of the analog input 70.

Figure 2:
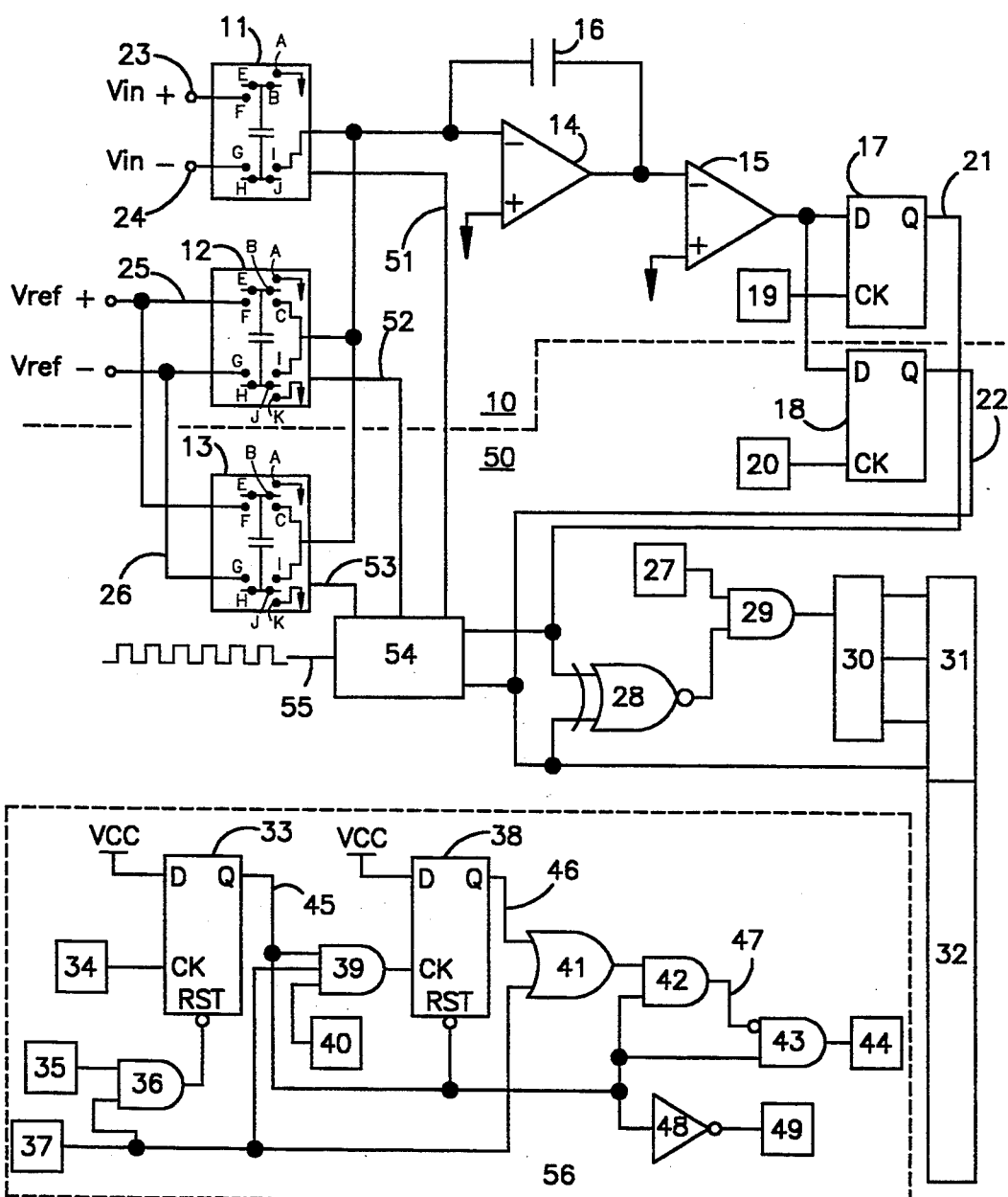
FIG. 2 is a diagram showing a typical implementation for part of the prior art sigma-delta converter of FIG. 1 plus the additional circuitry in accordance with the present invention for extending the resolution of the conversion provided by the converter.

Referring now to FIG. 2, there is shown a typical implementation 10 for part of the prior art sigma-delta converter of FIG. 1 plus the additional circuitry 50 in accordance with the present invention for extending the resolution of the conversion provided by the converter. FIG. 2 depicts at 10 a typical hardware implementation of the sigma-delta converter shown in FIG. 1 minus the digital filter 74 and output 77. The analog input 70 is represented as differential input $V_{in}$ 23 and 24 to capacitor block 11. The summing integrator function of 71 and 72 are performed by the repetitive switching of charge from capacitor blocks 11 and 12 into an integrator circuit consisting of operational amplifier 14 and capacitor 16. The input to capacitor block 12 is a differential reference voltage, $V_{ref}$, 25 and 26. The comparator 15 functions as comparator 73.

The D type flip-flop 17 holds the output of the comparator 15 after each clock cycle 19. The output of the comparator represents the polarity of capacitor 16 in integrator circuit 14 and 16 after each clock cycle period 19. The clock cycle 19 period is usually the same as the switching cycle of the prior art sigma-delta converter. The switching clock timing is designed so that, for example, block 11 is switched first, then block 12 and then clock 19. The one (1) bit output 76 of FIG. 1 is now 21 of FIG. 2. Logic 54 uses the data on 21 to select the polarity of capacitor block 12 to be next applied to the integrator circuit. Block 12 performs the function of the DAC 75 in FIG. 1.

The use by logic 54 of the data on 21 to select the polarity of capacitor block 12 to be next applied to the integrator circuit provides feedback in the loop comprising blocks 11 and 12, operational amplifier 14 and capacitor 16, comparator 15 and flip-flop 17. This loop is equivalent to the feedback loop 71, 72, 73, 76 and 75 of FIG. 1. The function of the feedback loop of FIG. 2 is to apply the proper polarity orientation of V ref 25 and 26 charged in capacitor block 12 to the integrator circuit 14 and 16 in an attempt to zero the input to comparator 15. The capacitors in blocks 11 and 12 can be of the same capacitance or set at a predetermined ratio other than one to one.

A typical clock signal 55 such as from a crystal oscillator, feeds into logic 54. Gated signals 51, 52, 53 control the switching capacitor operation in blocks 11, 12, and 13 respectively. A second signal is provided for signal lines 52, 53 which permits control of the capacitor switching polarity orientation based on the logic 54 outputs 21 and 22 respectively. The function of block 13 and output 22 will be described below.

As is shown in FIG. 1, the one (1) bit sequence 21 can be filtered by digital filter 74 for a specific period of time and produce a digital representation at output 77. It is common to use a specific period of time which is a multiple of the most dominant noise source periods. A period of one or more cycles of the standard 50 or 60 Hertz line frequencies are commonly used in order to eliminate noise from those frequencies. The period of time for which the one bit sequence is digitally filtered is normally followed by an idle time which could be used to perform a number of functions such as resetting the integrator capacitor or channelling in a different analog input 70 to measure.

The digital filtering can be as simple as an up counter or become more elaborate using decimation and digital signal processing techniques. The simple up counter can be reset prior to starting the analog to digital conversion period, count the bit sequence from 21 for a predetermined period of time and use the end count as the digital representation of the differential voltage analog input 23 and 24.

FIG. 2 portrays at 50 one embodiment for the present invention. The D flip-flop 18 takes in data from the output of comparator 15. As was described above, the output of comparator 15 represents the polarity of the capacitor 16 in the integrator circuit 14 and 16. At a specific time the clock edge from 20 latches the polarity information and holds this information on output 22. The outputs 21 and 22 of flip-flops 17 and 18 are connected to the inputs of exclusive NOR gate 28. The output of gate 28 is connected to one input of two input AND gate 29 whose other input receives an enable signal 27. A separate auxiliary counter 30 is enabled by the exclusive-oring of the single bits of the D flip-flop outputs 21 and 22 anded at gate 29 with the enable signal 27. A latching device 31 is used to store the count in the counter 30 and the polarity bit on 22.

The digital representation from the basic sigma-delta converter 10 is portrayed as latch 32. At the end of the conversion time period the embodiment 50 provides in the manner described below the resolution extension, by a predetermined number of bits, of the digital representation 32 initially provided by converter 10. The predetermined number of resolution extending bits are portrayed at 31. The representations 31 and 32 are combined which, in effect, results in a virtual shift to the left of the representation 32 by the predetermined number of bits in representation 31. One of the predetermined number of bits is the polarity information on output 22. The remaining predetermined number of bits appear at the output of auxiliary counter 30 and determines the number of counts that will, depending on the polarity information, either be added to or subtracted from the shifted digital representation 32.

The number of remaining bits at the output of counter 30 sets the absolute value of the maximum number of counts that can be added to or subtracted from the shifted digital representation 32. The range for the resolution extension provided by embodiment 50 is determined by the combination of the polarity bit and the absolute value. For example, if the predetermined number of resolution extending bits is four the representation 32 is, in effect, shifted to the left four bit positions. The absolute value of the range of counts that can be added to or subtracted from the "shifted" representation 32 is zero to seven (0 to 7). Since a fraction of a count does not give rise to resolution extension, the resolution extension range provided, in this example, by embodiment 50 is ±seven counts.

At the end of the conversion period, capacitor 16 contains an error voltage whose polarity is contained in the bit on output 22. The present invention uses the polarity bit on output 22 and the charge in capacitor block 13 to provide the resolution extension by forcing the error voltage to cross through zero. The polarity bit is used to determine the orientation of the charge in capacitor block 13 that will force the error voltage across capacitor 16 to cross through zero. The present invention uses auxiliary counter 30 to count, from an initial count of zero, the number of counts required to accomplish the same. It is that count which appears in representation 31. As will be described below, the present invention includes means to prevent the counting of the auxiliary counter and thus provide no resolution extension, if the error voltage in capacitor 16 at the end of the conversion period is less than a predetermined amount such as a fraction of a count.

Figure 3:
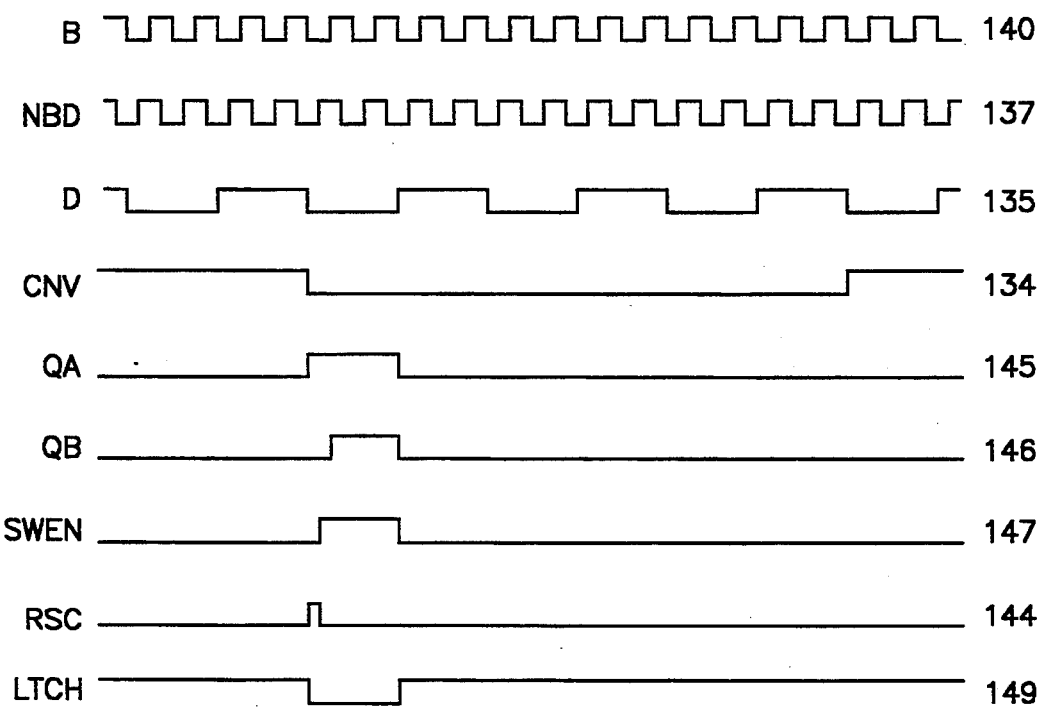
FIG. 3 is a diagram which shows the timing relationship between conversion and the extending resolution operation.

The logic 54 uses the incoming clock signal 55 in order to generate the conversion time period discussed above as well as other useful timing signals which are shown in FIG. 3 and are described below. Clock dividers such as toggle flip-flops, data flip-flops, and simple gate logic can be used in logic 54. The logic design for such signal generation is obvious to anyone skilled in the art and will therefore not be discussed in detail. The hardware circuitry 56 at the bottom of FIG. 2 is part of logic 54 and is used to implement the generation of timing signals portrayed in FIG. 3.

The circuitry 56 produces an output 45, which is designated in FIG. 3 as "QA" 145, from D flip-flop 33. Output 45 is clocked from a convert signal 34, which is designated in FIG. 3 as "CNV" 134. The AND gate 36 is used to reset flip-flop 33 and has inputs from a clock 35, which is designated in FIG. 3 as "D" 135, and from a clock 37, which is designated in FIG. 3 as "NBD" (Not B Delayed) 137. Another D flip-flop 38 is clocked from an AND gate 39, which has inputs from output 45, NBD clock 37, and a clock 40 which is designated in FIG. 3 as "B" 140. The signal 45 resets flip-flop 38.

The output of flip-flop 38 produces a signal 46, which is designated in FIG. 3 as "QB" 146. It is the "QB" signal that feeds signal 27 to enable the auxiliary counter 30. Signals 46 and 37 feed into an OR gate 41 which has its output connected to one input of two input AND gate 42. Output 45 is connected to the other input to gate 42. The output of AND gate 42 is a signal 47, which is designated in FIG. 3 as "SWEN" 147. This signal 47 gets inverted and is one input to a two input AND gate 43 which has as its other input the output 45. The output of this AND gate 43 produces a signal 44 in the form of a pulse, which is designated in FIG. 3 as "RSC" 144. Signal 45 is inverted with inverter 48 and produces a signal 49, which is designated in FIG. 3 as "LTCH" 149.

In FIG. 3, the waveforms 140, 137, 135 are basic clock signals. The "NBD" signal 137 is the inverse of signal "B" 140 delayed by ¼ of "B"'s cycle time. The analog switching cycle time could be for example ¼ of "B"'s cycle time. While the convert signal 134 is high, it is assumed that the conventional sigma-delta converter 10 is running and will have the digital representation 32 available when the convert signal 134 goes low. When the convert signal is low the conventional sigma-delta circuit is typically idle. It is during this first part of the idle time that circuit 50 functions to provide the resolution enhancement of the present invention.

When the convert signal 134 goes low the conventional sigma-delta circuit 10 goes into the idle condition, that is, circuit 10 is not performing analog to digital conversion. Hence, capacitor switching ceases and the charge on capacitor 16, which is related to the error voltage, is held. The "QA" signal 145 is feeding 20 which latches the direction polarity bit from the comparator 15 output. This direction bit 22 sets the polarity orientation of capacitor block 13. This direction dictates the orientation of charge in block 13 that will force the error voltage across integrating capacitor 16 to cross through zero. At this same time the auxiliary count reset signal "RSC" 144 pulse clears the auxiliary count. After this the "SWEN" 147 signal allows the sigma-delta circuit to enable its switching functionality; however, only for capacitor blocks 11 and 13.

Capacitor block 12 is idle and does not switch during this non conversion time period. In a sense, capacitor block 13 takes over the function and clock timing location of capacitor block 12. Capacitor block 12 is only operative during the conversion period of the overall cycle; whereas, capacitor block 13 is only active for a short time after the conversion period ends. The circuitry 10, 50 runs one switched integration of blocks 11 and 13, before the auxiliary counter is enabled with "QB" 146. This permits the digital representation 32 to not be affected if the error voltage in the integration capacitor 16 is less than one count of the extended resolution.

The capacitor blocks 11 and 13 continue to switch until "SWEN" 147 goes low. The auxiliary count enable from AND gate 29 will terminate as soon as signals 21 and 22 differ in state. In other words, the auxiliary count stops when the initial polarity of the error voltage in capacitor 16 reverses. At the end of the extended resolution function period the "LTCH" signal goes high latching the count in the auxiliary counter 30 to 31.

Referring once again to FIG. 2, an overview of the functional operation of the present invention will now be provided. During the conventional sigma-delta conversion period the input voltage capacitor 11 and the reference voltage capacitor 12 take turns applying charge transfers to the integrator circuit 14, 16. At the beginning of the conversion period the input voltage is applied to the integrator circuit for a predetermined period of time. At the end of that predetermined period of time, the reference voltage is then applied to the integrator circuit for the same predetermined period of time and with a polarity determined by output 21 so as to counter the polarity of the voltage in capacitor 16 at the end of the application of the input voltage.

The application of the input voltage followed by the application of the reference voltage may be thought as a charge transfer pair. The number of charge transfer pairs applied to the integrator circuit during the conversion period should always be a whole integer number. For example, the predetermined period of time can be selected as one millisecond giving two milliseconds for the time to complete a charge transfer pair. If during the conversion period fifty such pairs are applied to the integrator circuit the conversion period would be 100 milliseconds which is a whole integer multiple of the period of the 50 or 60 Hertz standard line frequencies. As was described above in connection with FIG. 1., it is common to use for the conversion period a period which is a whole integer multiple of the period of either 50 or 60 Hertz.

The polarity of the reference voltage applied to the integrator circuit is shown by the setting of the switches, shown in FIG. 2, internal to block 12. The setting of the switches is controlled by signal 52 from logic 54. Therefore, the switches allow the reference voltage on the capacitor in block 12 to be applied to the integrator circuit 14, 16, with either a positive or a negative polarity.

At the end of the specific time period for which the conventional sigma-delta conversion is run, a residual error term is left across capacitor 16. Capacitors 11 and 12 no longer transfer charge. The ending comparator 15 polarity is on output 22 and the logic 54 determines the correct orientation for capacitor 13 charge transfers to zero the residual error. As can be seen from FIG. 2, block 13 also includes internal switches which are controlled by signal from logic 54. A predetermined capacitance ratio is set between capacitors 12 and 13. The ratio determines the resolution extension provided by the present invention. This ratio could, for example, be that capacitance of capacitor 13 is ⅛ the capacitance of capacitor 12 in order to extend the resolution 4 bits or ±0 to 7 total counts.

The capacitor 13 charge is transferred repetitively to integrator circuit 14, 16 until the error term crosses zero. The auxiliary counter 30 determines the number of charge transfers required to do this. The counter logic permits an "adjustment not needed" feature by not counting the first charge transfer. The ending polarity 22 indicates the direction of the applied charge and hence whether the auxiliary count 30 should be added or subtracted.

As can be appreciated ideal environments rarely exist when it comes to implementing an apparatus in the real world. Noise exists in the real world and can inadvertently cause erroneous operation. Such is the case with the comparator 15 sensing the integrator 14 error voltage on capacitor 16. If the error voltage is close enough to zero to be within the noise level range, then the comparator could mistakenly assume the wrong polarity due to the noise influence. There are two different techniques which can be used to eliminate this potential error.

The first such technique allows the auxiliary counter 30 to operate for the duration of an enabled time period. This time period would be such that it would allow the counter to roll back over to the zero count. For example, a 4 bit extension allowing ±0 to 7 counts uses only the three least significant bits of auxiliary counter 30. As was described above, the present invention upper limits this enable count to 7. If instead an enable count period is chosen that stops the count at 8, that is a binary 1000, the three least significant bits are still 000 which is zero, and is the desired result.

The second such technique is slightly more sophisticated but accounts for noise causing a near +8 or −8 count situation as well as near zero situation as in the above example. The charge 13 is first applied in the opposite direction and then in the direction latched in output 22. Logic is used to verify that the application of the opposite direction does differ in comparator polarity 15 from the latched direction 22 polarity. This verifies that noise did not corrupt the direction bit 22. The following correct direction transfer takes the error voltage on capacitor 16 back to where the invention would have started as described previously. Eliminating the potential for error near zero permits a true full span count error (above 7 counts in the above example) to be realized. Clearly this second technique would upper limit the auxiliary count (such as to 7 in the above example).

Figure 4:
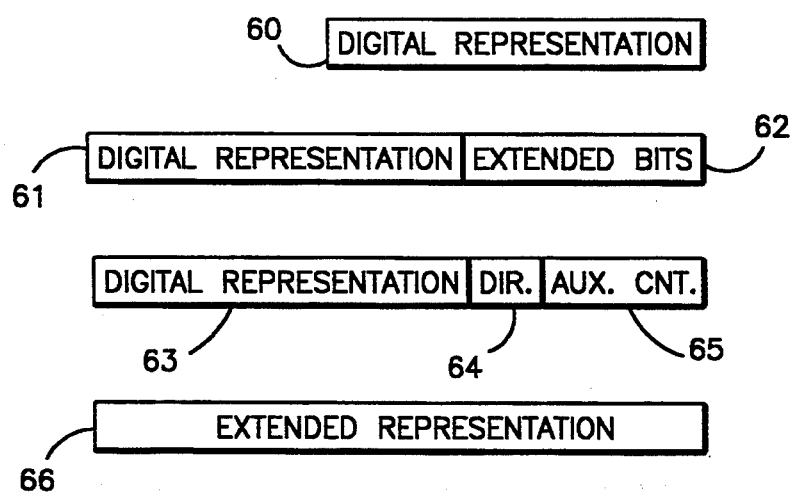
FIG. 4 shows the block form of the digital representation as constructed for the resolution extension method and apparatus.

FIG. 4 shows how the conventional digital representation 60, which is the contents of latch 32 of FIG. 2, provided by the prior art sigma-delta converter is manipulated to give the extended resolution representation 66 provided by the present invention. The extended resolution 66 can be divided into most significant bits 61, wherein the conventional digital representation 60 is stored and extended or least significant bits 62. The extended bits 62 of the extended representation are provided by the invention in the form of the direction information 64, which is the polarity information on output 22 of FIG. 2, and auxiliary count 65, which is the representation 31 from counter 30 of FIG. 2. Hence, the entire extended representation 66 consists of the conventional digital representation 61 which in effect has undergone a virtual shift to the left by the number of extended bits 62, direction information 22, and auxiliary count 31 from counter 30.

The method to provide the extended resolution may be implemented either in hardware or with a microprocessor function. A hardware implementation would consist of a two input adder with its first input as 61 gained by the bit extension provided by the extended or least significant bits 62 Of the extended representation. The gain function can be performed as simply as doing a multiple bit shifting. The second input to the adder would be the auxiliary count 31 from counter 30. The polarity or direction information of the bit 22 merely dictates whether an addition or subtraction of the auxiliary count will take place. In practice logic would alter the second input if a subtraction was required. For example, if the polarity or direction information bit 22 indicates a subtraction, then the two's complement plus one of the second input may be added. The result of the addition, which appears at the output of the adder, is used directly as the true extended digital representation of the analog input.

The auxiliary count 31 in FIG. 2 is either added or subtracted from the conventional count in 32. However, it should be recalled that the most significant bits 61 of the extended representation 66 in FIG. 4 are, in effect, the conventional representation 60 virtually shifted to the left by the number of extended bits 62. As an example, if the count in 32 is 100 decimal and the number of extended bits 62 added by the extended representation 66 are four (4), then the conventional representation is virtually shifted to the left by four bits and can be thought of as 1600 decimal. If the auxiliary count 31 was 5 and it was to be subtracted from the conventional representation 60, then the extended representation 66 result would be 1595 decimal.

In order to keep the hardware circuitry to a minimum, a micro-processor could be used to perform the above functions. The extended representation 66 is read into the microprocessor. A bit test of the direction information in location 64 dictates whether an addition or subtraction will take place. The first value 61 from count 32 masks off the lower bits by an AND function with zeroes for locations in 64 and 65. The second value 65 from count 31 masks off the higher bits by an AND function with zeroes for locations in 63 and 64. The first value is loaded and addition or subtraction of the second value, as dictated by the polarity or direction information bit 64, takes place. This result is the true extended digital representation of the analog input.

Another advantage to using the technique of the present invention to extend the resolution of a sigma-delta type converter is that the extended resolution technique allows for a major power saving as compared to the power consumption of a conventional sigma-delta type converter. Given a required fixed resolution to meet, the operating frequency may be dropped significantly by incorporating the resolution extension technique of the present invention. It is well known that frequency is directly related to power consumption, especially in CMOS devices. This is largely due to the capacitive nature of these devices. Reducing the operating frequency of the sigma-delta converter by a factor of sixteen, for example, would reduce the power consumption of a CMOS circuit embodiment thereof by almost the same factor thus making it very attractive for low power applications. Therefore, one advantage that the present invention has over the conventional sigma-delta method is that it allows the use of low power consumption devices without any loss in resolution.

In order to demonstrate the improvement provided by the present invention over existing methods, three tests were run with a resolution extension of 4 bits. The first two tests had a conventional sigma-delta period of 100000 cycles. The set up had an analog input span of ±5 volts ($V_{ref}$=5 volts) and used an up counter for the digital filtering.

The analog input voltage for the first test was $+3\frac{1}{3}$ volts. The ending digital representation using only a conventional sigma-delta method was 83333 out of 100000, which would correlate to 3.33330000 volts. Applying the invention method, the true extended digital representation was 1333333 out of 1600000, which correlates to 3.33333125. Hence, the invention yielded 16 times better results than the conventional sigma-delta method.

In the second test, the analog input voltage was set to +2.5 volts. The ending digital representation using only a conventional method was 75000 out of 100000, which would correlate to +2.5 volts. The true extended digital representation was 1200000 out of 1600000, which correlates to 2.5 volts. Hence, even when the conventional method happens to yield correct results, the invention result yields exact results as well.

In the third test, it was shown that using the invention to extend resolution yielded the same results as the first test example, but at 1/16 of the cycles. The analog input voltage was set to $+3\frac{1}{3}$ volts and the conventional sigma-delta period was set to 6250 cycles. The ending digital representation using only the conventional method was 5208 out of 6250, which correlates to +3.3328 volts. The true extended digital representation was 83333 out of 100000, which correlates to +3.3333 volts. Hence, the present invention again yielded 16 times better results than the conventional sigma-delta method. The frequency was 16 times less than the first test example run; yet, in the third test the present invention produced equivalent performance results to the conventional method in the first test.

Another advantage of the present invention is that the period of time for which the analog input is connected remains at the conversion period of the conventional sigma-delta circuit; hence, the noise rejection for the period of time selected is not compromised. In other words, the invention maintains the noise rejection properties of prior converters that is obtained by setting the conversion period equal to a multiple of the noise periods of interest such as line frequencies.

Another feature of this invention is the method of calibrating the resolution extension. During manufacture of the circuit shown in FIG. 2, as for example in the form of an integrated circuit chip, the manufacturer selects the capacitance of the capacitors of blocks 12 and 13 in accordance with a requirement of a predetermined capacitance ratio therebetween. However, the manufacturer can only match the predetermined ratio within a certain tolerance. In addition, stray capacitance, small charge loss, and other non-ideal properties inherent in the physical make up of the switched capacitor integrator circuit can become significant based on several factors in the manufacturing of the chip, including the predetermined ratio and capacitor size of capacitors 12 and 13.

In general, the more extended bits 62 that are added by the present invention, the more significant will be the effect of the non-ideal properties on the auxiliary count 65. Using a small number of extended bits would likely make the effect of the non-ideal on the auxiliary count negligible. However, it may be desirable or required to use a large number of extended bits in the present invention. In that instance there may arise non-monotonic and missing code performance which would need to be resolved for certain applications of the invention.

Once the circuit of the present invention is operational a calibration procedure, described in detail below, may be used to substantially eliminate the effect of these non-ideal properties. The calibration procedure will give rise to an auxiliary count scaling factor that can be based on the direction bit of the auxiliary count range. In that instance, separate calibration scaling factors could apply to the two directions.

A predetermined analog input voltage is applied at terminals 23, 24. The analog input voltage is slowly increased so as to provide for a true monotonic, that is, no missing codes response in the auxiliary count 65. The term monotonic is used herein to mean that there are no missing codes in the auxiliary count. The associated direction bit value is noted and the auxiliary count 65 is monitored starting from zero. The digital representation 63 should not change until after the auxiliary count has reached its full span value. The value of the calibrated span is defined as one plus the auxiliary count just before the digital representation changes to the next value.

An auxiliary count calibration scaling factor can be determined by dividing the known desired predetermined auxiliary count span by the calibrated span. This scaling factor can then be used as a multiplier to adjust the auxiliary count to a calibrated auxiliary count. This method can be used in a similar manner to determine the calibration scaling factor for the other associated direction auxiliary count range by using a predetermined decreasing input voltage. The calibrated auxiliary count is used in place of the auxiliary count in calculations as described previously in the embodiment of the invention.

Enhancements and alterations to the above calibration method can include relating various calibration scaling factors with predetermined digital representation 60 ranges, and/or temperature, or other factors which may effect the physical properties of integrated circuit chip. Having an auxiliary counter 30 which is capable of a larger count range than the desired auxiliary count range would allow calibration of both over count as well as under count of the auxiliary count 65.

Another embodiment of the invention includes having a fourth capacitor block, similar to capacitor block 13. However, the fourth capacitor block has a ratio which is based on a fraction of one extended count magnitude such as one-half out of the +8 count extension. Hence, the capacitor value for the fourth capacitor block, in this case, would be one sixteenth of the reference capacitor. This fourth capacitor block is applied much the same as and in place of capacitor block 13 only for the initial cycle of the resolution extension function operation; thereby, giving the auxiliary count a ½ count bias which yields an equivalent 0.5 and above round up function for the auxiliary counter.

It is to be understood that the description of the preferred embodiments are intended to be only illustrative, rather than exhaustive, of the present invention. Those of ordinary skill will be able to make certain additions, deletions, or modifications to the embodiments of the disclosed subject matter without departing from the spirit of the invention or its scope, as defined by the appended claims.

What is claimed is:

1. A method for use in a sigma-delta type analog to digital converter having an input and output to obtain an extended representation at said converter output of an analog signal amplitude present at said converter input, said method comprising the steps of:
   i. generating internal to said converter at the end of a first predetermined interval of time an unextended digital representation of said analog signal amplitude present at said converter input;
   ii. holding a charge representative of an error term in said unextended digital representation at said first predetermined interval of time end;
   iii. disconnecting said analog signal from said input at said first predetermined interval of time end;
   iv. determining from said error term representative charge one bit that represents the polarity of a charge to be repetitively applied to said error term representative charge to cause said error term representative charge to cross zero;
   v. applying repetitively for a second predetermined interval of time said zero crossing charge with said determined polarity to said error term representative charge;
   vi. counting with a predetermined number of counting bits each of said repetitive applications of said zero crossing charge with said determined polarity except for said first repetitive application, said counting ending when said error term representative charge crosses zero;
   vii. appending when said counting ends said polarity and said repetitive applications count to said unextended digital representation; and
   viii. extending when said counting ends said unextended digital representation by:
      a. virtually shifting in a predetermined direction said unextended representation by said predetermined number of counting bits and said one bit for said determined polarity;
      b. adding said repetitive applications count when said counting ends to said unextended digital representation if said polarity is in one direction; or
      c. subtracting said repetitive applications count when said counting ends from said unextended digital representation if said polarity is in an opposite direction,
         to thereby obtain said extended digital representation at said converter output.

2. The method of claim 1 wherein said converter has conversion means and said step of generating internal to said converter at said first predetermined interval of time end an unextended representation of said analog signal amplitude at said converter input includes the step of applying repetitively said analog signal amplitude and a predetermined amount of a reference charge to said conversion means; and said method further includes the step of selecting a predetermined amount of said zero crossing charge in a predetermined ratio to said predetermined amount of said reference charge.

3. The method of claim 1 wherein said repetitive applications count is calibrated using a method comprising the steps of:
  i. setting said analog signal amplitude present at said converter input to a predetermined amplitude;
  ii. increasing said predetermined amplitude slowly;
  iii. monitoring said repetitive applications count for a transition therein which is other than a single and monotonic increment;
  iv. defining an increasing continuous extension span as said repetitive applications count just prior to said transition therein which is other than a single and monotonic increment when said other than transition occurs before said repetitive applications count has filled all of said predetermined number of counting bits and defining said increasing continuous extension span as one plus said repetitive applications count when all of said predetermined number of counting bits are filled without said other than transition occurring before all of said predetermined number of counting bits are filled;
  v. calculating an increasing span factor as one plus said repetitive applications count when all of said predetermined counting bits are filled divided by said increasing continuous extension span;
  vi. decreasing said predetermined analog input voltage slowly;
  vii. monitoring said repetitive applications count for a transition therein which is other than a single and monotonic decrement;
  viii. defining a decreasing continuous extension span as said repetitive applications count just prior to said transition therein which is other than a single and monotonic decrement when said other than transition occurs before said repetitive applications count has filled all of said predetermined number of counting bits and defining said decreasing continuous extension span as one plus said repetitive applications count when all of said predetermined number of counting bits are filled without said other than transition occurring before all of said predetermined number of counting bits are filled;
  ix. calculating a decreasing span factor as one plus said repetitive applications count when all of said predetermined counting bits are filled divided by said decreasing continuous extension span; and
  x. calculating a calibrated repetitive applications count when said counting ends by multiplying said repetitive applications count when said counting ends by said increasing span factor when said determined polarity is positive or by said decreasing span factor when said determined polarity is negative.

4. An apparatus for use in a sigma-delta type analog to digital converter having an input and output to obtain an extended representation at said converter output of an analog signal amplitude present at said converter input, said apparatus comprising:
  i. means for generating internal to said converter at the end of a first predetermined interval of time an unextended digital representation of said analog signal amplitude present at said converter input;
  ii. means for holding a charge representative of an error term in said unextended digital representation at said first predetermined interval of time end;
  iii. means for disconnecting said analog signal from said input at said first predetermined interval of time end;
  iv. means responsive to said error term representative charge for determining one bit that represents the polarity of a charge to be repetitively applied to said error term representative charge to cause said error term representative charge to cross zero;
  v. means for applying repetitively for a second predetermined interval of time said zero crossing charge with said determined polarity to said error term representative charge;
  vi. means for counting with a predetermined number of bits each of said repetitive applications of said zero crossing charge with said determined polarity except for said first repetitive application, said counting means ceasing counting when said error term representative charge crosses zero;
  vii. means responsive to said counting means ceasing counting for appending said polarity and said repetitive applications count to said unextended digital representation; and
  viii. means responsive to said counting means ceasing counting for extending said unextended digital representation, said extending means:
    a. first virtually shifting in a predetermined direction said unextended representation by said predetermined number of counting bits and said one bit for said determined polarity; and then either
    b. adding said repetitive applications count when said counting ends to said unextended digital representation if said polarity is in one direction; or
    c. subtracting said repetitive applications count when said counting ends from said unextended digital representation if said polarity is in an opposite direction,
    to thereby obtain said extended digital representation at said converter output.

5. The apparatus of claim 4 wherein said converter has conversion means and said means for generating internal to said converter at said first predetermined interval of time end an unextended representation of said analog signal amplitude at said converter input includes means for repetitively applying said analog signal amplitude and a predetermined amount of a reference charge to said conversion means; and said a predetermined amount of said zero crossing charge is selected in a predetermined ratio to said predetermined amount of said reference charge.

6. The apparatus of claim 4 wherein said apparatus is calibrated by a further apparatus, said further apparatus comprising:
  i. means for setting said analog signal amplitude present at said converter input to a predetermined amplitude;
  ii. means for increasing said predetermined amplitude slowly;
  iii. means for monitoring said repetitive applications count for a transition therein which is other than a single and monotonic increment;
  iv. means for defining an increasing continuous extension span as said repetitive applications count just prior to said transition therein which is other than a single and monotonic increment when said other than transition occurs before said repetitive applications count has filled all of said predetermined number of counting bits and defining said increasing continuous extension span as one plus said repetitive applications count when all of said predetermined number of counting bits are filled without said other than transition occurring before all of said predetermined number of counting bits are filled;

v. means responsive to said increasing continuous extension span for calculating an increasing span factor as one plus said repetitive applications count when all of said predetermined counting bits are filled divided by said increasing continuous extension span;

vi. means for decreasing said predetermined analog input voltage slowly;

vii. means for monitoring said repetitive applications count for a transition therein which is other than a single and monotonic decrement;

viii. means for defining a decreasing continuous extension span as said repetitive applications count just prior to said transition therein which is other than a single and monotonic decrement when said other than transition occurs before said repetitive applications count has filled all of said predetermined number of counting bits and defining said decreasing continuous extension span as one plus said repetitive applications count when all of said predetermined number of counting bits are filled without said other than transition occurring before all of said predetermined number of counting bits are filled;

ix. means responsive to said decreasing continuous extension span for calculating a decreasing span factor as one plus said repetitive applications count when all of said predetermined counting bits are filled divided by said decreasing continuous extension span; and x. means responsive to said counting means ceasing counting for calculating a calibrated repetitive applications count by multiplying said repetitive applications count when said counting means ceases counting by said increasing span factor when said determined polarity is positive or by said decreasing span factor when said determined polarity is negative.

* * * * *